United States Patent
Wu et al.

(10) Patent No.: US 11,703,532 B2
(45) Date of Patent: Jul. 18, 2023

(54) DEVICE OF MEASURING DUTY CYCLE AND COMPENSATION CIRCUIT UTILIZING THE SAME

(71) Applicant: RichWave Technology Corp., Taipei (TW)

(72) Inventors: Po-Wei Wu, Taipei (TW); Hsiang-Jen Jao, Taipei (TW); Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/495,825

(22) Filed: Oct. 7, 2021

(65) Prior Publication Data

US 2023/0060339 A1    Mar. 2, 2023

(30) Foreign Application Priority Data

Aug. 25, 2021 (TW) ................. 110131455

(51) Int. Cl.
*G01R 29/00* (2006.01)
*G01R 29/027* (2006.01)
(52) U.S. Cl.
CPC ................ *G01R 29/0273* (2013.01)
(58) Field of Classification Search
USPC .......................... 324/76.55, 76.77
See application file for complete search history.

(56) References Cited

U.S. PATENT DOCUMENTS

| 10,784,846 | B1 * | 9/2020 | Bucossi | ............... | H03M 1/745 |
| 2017/0364276 | A1 * | 12/2017 | Bhuiyan | ............... | G11C 29/028 |
| 2019/0004111 | A1 * | 1/2019 | Miwa | ............... | G01R 29/023 |
| 2020/0174963 | A1 | 6/2020 | Panshin | | |

FOREIGN PATENT DOCUMENTS

| CN | 105577053 A | 5/2016 |
| EP | 1 043 917 A2 | 10/2000 |
| TW | 201244047 A1 | 11/2012 |
| WO | 2019/126062 A1 | 6/2019 |

OTHER PUBLICATIONS

Office action dated Jun. 9, 2022 for the Taiwan application No. 110131455, filing date Aug. 25, 2021, pp. 1-3.

* cited by examiner

*Primary Examiner* — Vincent Q Nguyen
(74) *Attorney, Agent, or Firm* — Winston Hsu

(57) ABSTRACT

A device of measuring a duty cycle includes a resistor-capacitor circuit and a control circuit. The resistor-capacitor circuit is used to generate a first voltage when a reference signal is in a first state, and generate a second voltage and a third voltage when the reference signal is in a second state. The control circuit is coupled to the resistor-capacitor circuit, and configured to acquire an ON-time according to the first voltage, the second voltage and the third voltage. The ON-time is a time interval during which the reference signal is in the first state.

19 Claims, 5 Drawing Sheets

DEVICE OF MEASURING DUTY CYCLE AND COMPENSATION CIRCUIT UTILIZING THE SAME

CROSS REFERENCE TO RELATED APPLICATION

This non-provisional application claims priority of Taiwan patent application No. 110131455, filed on 25 Aug. 2021, included herein by reference in its entirety.

TECHNICAL FIELD

The present invention relates to an electronic circuit, in particular, to a device of measuring a duty cycle and a compensation circuit utilizing the same.

BACKGROUND

A front end module is a radio frequency circuit that converts a transmission signal into a radio frequency signal for wireless transmission. Front end modules are widely used in communication devices, network devices and electronic devices for transmitting various lengths of data.

However, the front end module will warm up after transmitting data for a period of time, resulting in a change of the gain of the front end module and unstable operations, increasing an error vector magnitude and increasing the error rate of data transmission.

SUMMARY

According an embodiment of the invention, a device of measuring duty cycles includes a resistor-capacitor circuit and a control circuit. The resistor-capacitor circuit is configured to generate a first voltage when a reference signal is in a first state, and generate a second voltage and a third voltage when the reference signal is in a second state. The control circuit is coupled to the resistor-capacitor circuit to acquire an ON time according to the first voltage, the second voltage and the third voltage. The ON time is approximately equal to a time of the reference signal being in the first state.

According to another embodiment of the invention, a compensation circuit includes a resistor-capacitor circuit and a control circuit. The resistor-capacitor circuit is configured to generate a first voltage when a reference signal is in a first state, and generate a second voltage and a third voltage when the reference signal is in a second state. The control circuit is coupled to the resistor-capacitor circuit, and configured to acquire an ON time of a front end module according to the first voltage, the second voltage, and the third voltage, and includes an adjustment circuit configured to generate a bias signal according to the ON time, and output the bias signal to the front end module.

DETAILED DESCRIPTION

Figure 1:
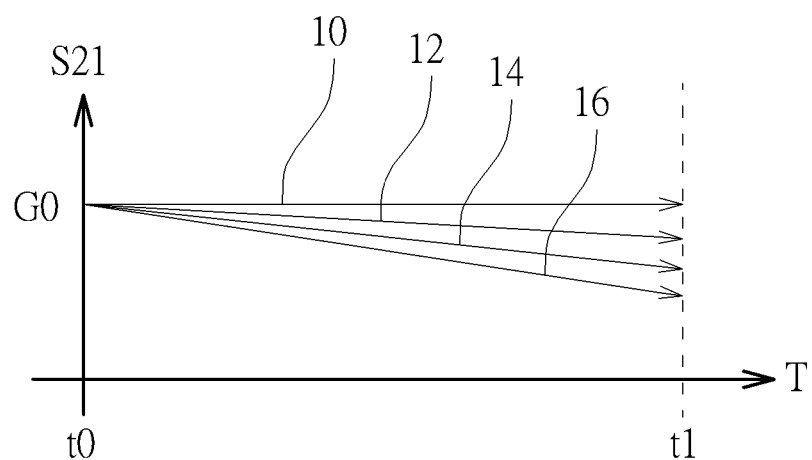
FIG. 1 shows gain variations with respect to the duty cycles.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

A front end module is enabled according to different duty cycles to transmit different lengths of data. The duty cycle will be larger when the length of the data is longer. FIG. 1 shows the gain variations with respect to the duty cycles, where the horizontal axis represents time T and the vertical axis represents gain S21. FIG. 1 shows an ideal gain curve 10 for all duty cycles, an actual gain curve 12 for a 10% duty cycle, an actual gain curve 14 for a 50% duty cycle, and an actual gain curve 16 for a 90% duty cycle. At Time t0, the front end module is in a cool-down state. The curves 10 to 16 show that the ideal gain of all duty cycles, the actual gain of 10% duty cycle, the actual gain of 50% duty cycle and the actual gain of 90% duty cycle are all a gain G0. At Time t1, the front end module has been operating for a period of time and has been warmed up. The curves 12 to 16 show the actual gain of 10% duty cycle, the actual gain of 50% duty cycle, and the actual gain of 90% duty cycle are less than the gain G0, and the curve 10 shows that the ideal gain is maintained at the gain G0. As the time elapses, the gradually accumulated heat will reduce the gain of the front end module. In the related art, since the heat generated by the front end module increases with the increase of the duty cycle, the actual gain curve 16 of the 90% duty cycle decreases faster than the actual gain curve 14 of the 50% duty cycle, and the actual gain curve 14 of the 50% duty cycle decreases faster than the actual gain curve 12 for the 10% duty cycle. Herein the actual gain of the front end module is negatively correlated with time and the duty cycles, decreasing the linearity and increasing the error vector magnitude (EVM). A device in the embodiment of the present invention may produce the gain of the curve 10, and maintain the gain unchanged across all duty cycles such as 10%, 50%, and 90%, maintaining the linearity unchanged while reducing the error vector magnitude to enhance the performance.

Figure 2:
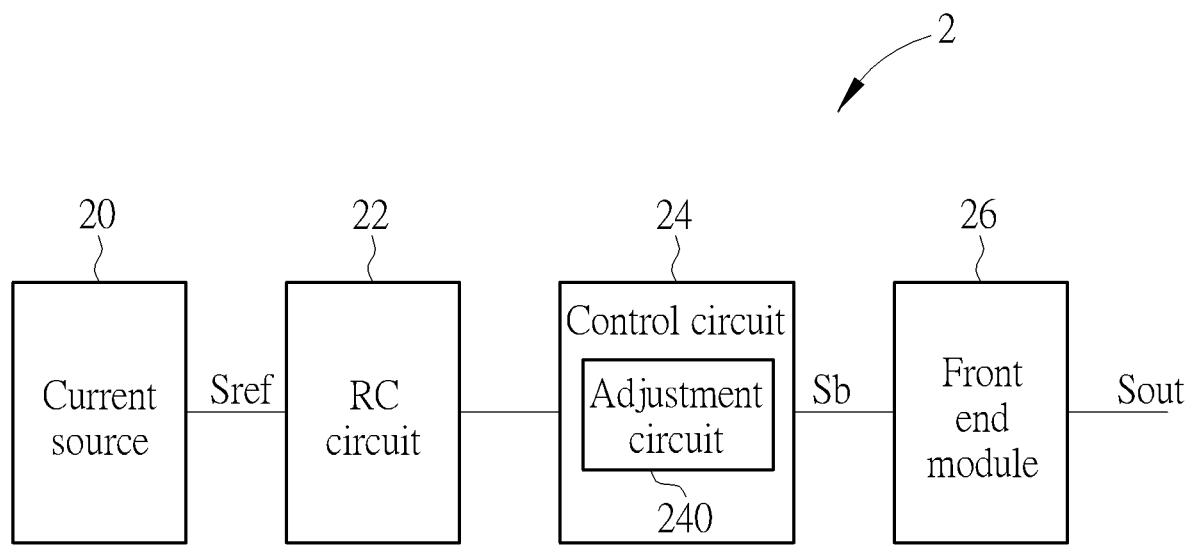
FIG. 2 is a block diagram of a device of measuring a duty cycle according to an embodiment of the invention.

FIG. 2 is a block diagram of a device 2 of measuring a duty cycle according to an embodiment of the invention. The device 2 may be used in a communication device, a network device or an electronic device. The device 2 may measure the duty cycle of the front end module 26 and compensate the bias signal Sb of the front end module 26 according to the duty cycle, so as to maintain the linearity unchanged, thereby reducing the error vector magnitude.

The device 2 includes a current source 20, a resistor-capacitor (RC) circuit 22, a control circuit 24, and a front end module 26 coupled in sequence.

The current source 20 in FIG. 2 may be a constant current source, a band gap circuit, or a low dropout voltage regulator for use to generate a reference signal Sref. The reference signal Sref may be set to one of a first state and a second state. For example, the reference signal Sref may be a constant current in the first state, and may be a zero current in the second state.

The RC circuit 22 in FIG. 2 may generate a first voltage when the reference signal Sref is in the first state, and generate a second voltage and a third voltage when the reference signal Sref is in the second state. In the first state, the reference signal Sref may charge the RC circuit 22 to generate the first voltage. In the second state, the RC circuit 22 may be discharged to generate the second voltage and the third voltage.

The control circuit 24 of FIG. 2 may acquire an ON time and/or an OFF time according to the first voltage, the second voltage and the third voltage. The ON time is approximately equal to the time of the reference signal Sref being in the first state, and the OFF time is approximately equal to the reference signal Sref being in the second state. In some embodiments, the control circuit 24 may compute the ON time and the OFF time according to the first voltage, the second voltage, and the third voltage. In other embodiments, the control circuit 24 may find the ON time from a look-up table according to the first voltage, the second voltage, and the third voltage. The control circuit 24 includes an adjustment circuit 240. The adjustment circuit 240 may generate an adjustment signal according to the ON time, and adjust the front end module 26 according to the adjustment signal. In some embodiments, the adjustment circuit 240 may generate the bias signal Sb according to the adjustment signal, and output the bias signal Sb to the front end module 26. For example, the bias signal Sb may be a bias voltage or a bias current.

The front end module 26 of FIG. 2 may be an amplifier circuit. The front end module 26 may receive the bias signal Sb to generate an output signal Sout. The output signal Sout may be a radio frequency signal. The bias signal Sb may be positively correlated to the ON time. When the ON time is longer, the duty cycle is larger, and the bias signal Sb will be larger to maintain the gain of the front end module 26 at the gain G0.

Figure 3:
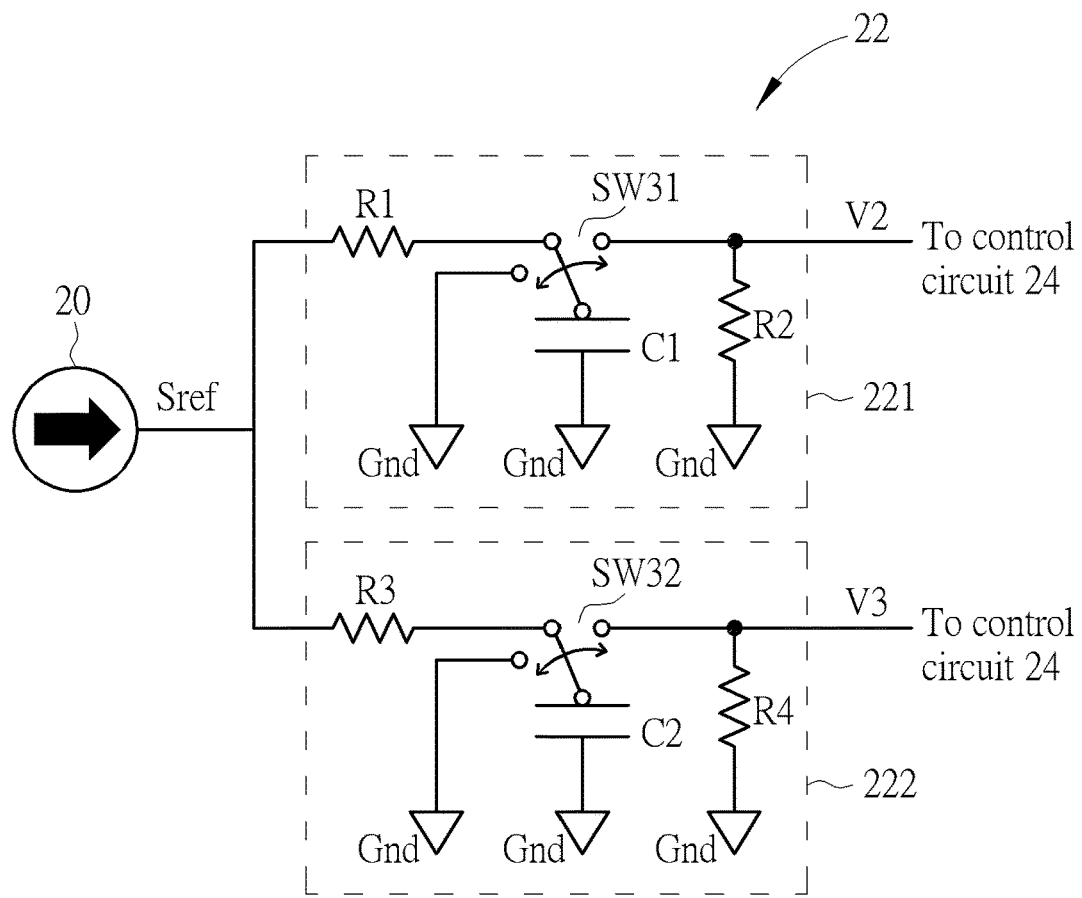
FIG. 3 is a circuit schematic of the resistor-capacitor circuit in FIG. 2 according to an embodiment of the invention.

FIG. 3 is a circuit schematic of the RC circuit 22 according to an embodiment of the invention. The RC circuit 22 includes an RC sub-circuit 221 and an RC sub-circuit 222. The RC sub-circuit 221 and the RC sub-circuit 222 are coupled to the current source 20 and the control circuit 24. The RC sub-circuit 221 includes a resistor R1, a storage capacitor C1, a resistor R2, and a switch SW31. The resistor R1 includes a first terminal and a second terminal. The resistor R2 includes a first terminal, and a second terminal coupled to the ground terminal Gnd. The voltage at the ground terminal Gnd may be 0V. The storage capacitor C1 includes a first terminal, and a second terminal coupled to the ground terminal Gnd. The switch SW31 may selectively couple the first terminal of the storage capacitor C1 to the ground terminal Gnd, the second terminal of the resistor R1, or the first terminal of the resistor R2. When the storage capacitor C1 is reset, the switch SW31 may couple the first terminal of the storage capacitor C1 to the ground terminal Gnd. When the storage capacitor C1 is charged, the switch SW31 may couple the first terminal of the storage capacitor C1 to the second terminal of the resistor R1. When the storage capacitor C1 is discharged, the switch SW31 may couple the first terminal of the storage capacitor C1 to the first terminal of the resistor R2. Similarly, the RC sub-circuit 222 includes a resistor R3, a storage capacitor C2, a resistor R4, and a switch SW32. The resistor R3 includes a first terminal and a second terminal. The resistor R4 includes a first terminal, and a second terminal coupled to the ground terminal Gnd. The capacitor C2 includes a first terminal, and a second terminal coupled to the ground terminal Gnd. The switch SW32 may selectively couple the first terminal of the capacitor C2 to the ground terminal Gnd, the second terminal of the resistor R3, or the first terminal of the resistor R4. When the storage capacitor C2 is reset, the switch SW32 may couple the first terminal of the storage capacitor C2 to the ground terminal Gnd. When the storage capacitor C2 is charged, the switch SW32 may couple the first terminal of the storage capacitor C2 to the second terminal of the resistor R3. When the storage capacitor C2 is discharged, the switch SW32 may couple the first terminal of the storage capacitor C2 to the first terminal of the resistor R4. The switching of the switch SW31 and the switch SW32 may be controlled by a circuit external to the device 2.

As shown in FIG. 3, the RC sub-circuit 221 includes a first path and a second path. The first path is a charging path formed along the resistor R1 and the storage capacitor C1. The second path is a discharging path formed along the storage capacitor C1 and the resistor R2. The first path and the second path share the storage capacitor C1. Likewise, the RC sub-circuit 222 includes a third path and a fourth path. The third path is a charging path formed along the resistor R3 and the storage capacitor C2. The fourth path is a discharging path formed along the storage capacitor C2 and the resistor R4. The third path and the fourth path share the storage capacitor C2.

Figure 4:
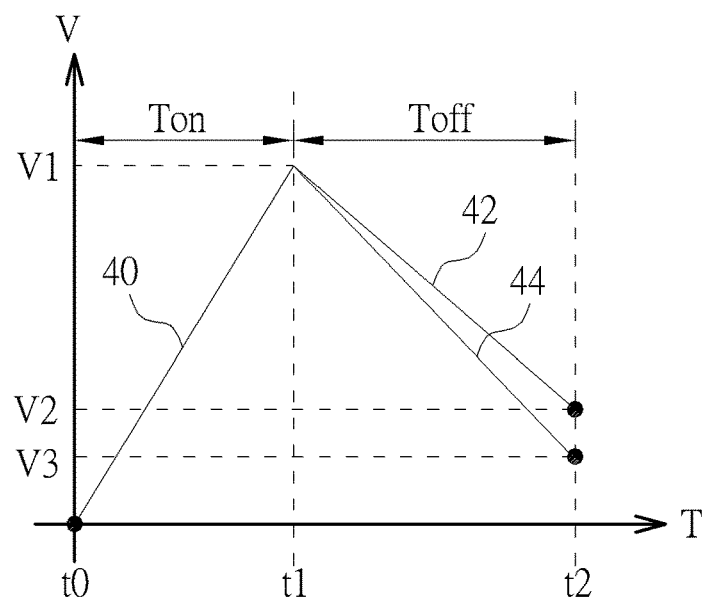
FIG. 4 shows the voltage of the resistor-capacitor circuit in FIG. 3.

In some embodiments, the resistance of the resistor R1 and the resistance of the resistor R3 may be equal, the resistance of the resistor R2 and the resistance of the resistor R4 may be different, and the capacitance of the storage capacitor C1 and the capacitance of the storage capacitor C2 may be equal. When the reference signal Sref is in the first state, the reference signal Sref may charge the storage capacitor C1 via the first path to generate the first voltage V1, and charge the storage capacitor C2 via the third path to generate the first voltage V1. When the reference signal Sref is in the second state, the RC sub-circuit 221 may discharge the storage capacitor C1 via the second path to generate the second voltage V2 after the OFF time has elapsed, and the RC sub-circuit 222 may discharge the storage capacitor C2 via the fourth path to generate the third voltage V3 after the OFF time has elapsed. The RC sub-circuit 221 and the RC sub-circuit 222 may respectively and simultaneously generate the second voltage V2 and the third voltage V3. The RC sub-circuit 221 and the RC sub-circuit 222 may operate simultaneously for computing the ON time. FIG. 4 shows the voltage of the RC circuit 22, where the horizontal axis represents time T and the vertical axis represents voltage V. The operation method of the RC circuit 22 is explained as follows with reference to FIG. 4.

The time interval between Time t0 and Time t1 is referred to as the ON time Ton, and the time interval between Time t1 and Time t2 is referred to as the OFF time Toff. In FIG. 4, a curve 40 shows the charging voltage of the storage capacitor C1 and the storage capacitor C2, a curve 42 shows the discharging voltage of the storage capacitor C1, and a curve 44 shows the discharging voltage of the storage capacitor C2.

At Time t0, the storage capacitor C1 is reset to 0V, and the storage capacitor C2 is reset to 0V. Between Time t0 and Time t1, the reference signal Sref charges the storage capacitor C1 and the storage capacitor C2, and the curve 40 shows that the voltages of the storage capacitor C1 and the storage capacitor C2 continue to increase. The product of the resistance of the resistor R1 and the capacitance of the storage capacitor C1 may be referred to as a charging time constant of the RC sub-circuit 221, and the product of the resistance of the resistance R3 and the capacitance of the storage capacitor C2 may be referred to as a charging time constant of the RC sub-circuit 222. The charging time constant is negatively correlated to the charging rate. If the resistance of the resistor R1 and the resistance of the resistor R3 are equal, and the capacitance of the storage capacitor C1 and the capacitance of the inductor C2 are equal, the charging time constant of the RC sub-circuit 221 will be equal to the charging time constant of the RC sub-circuit 222, and the voltage at the first terminal of the storage capacitor C1 and the voltage at the first terminal of the storage capacitor C2 will increase at identical charging rates. At Time t1, the storage capacitor C1 and the storage capacitor C2 both establish the first voltage V1, as expressed by Equation (1):

$$V1 = Ic * Ton \quad \text{Equation (1)}$$

Where V1 is the first voltage;
Ic is the charging current, equal to the constant current of the reference signal Sref; and Ton is the ON time.

Between Time t1 and Time t2, the storage capacitor C1 and the storage capacitor C2 are discharged, and the voltages at the storage capacitor C1 and the storage capacitor C2 continue to decrease. The curve 42 and the curve 44 show that the storage capacitor C1 discharges at a slower rate than the storage capacitor C2. The product of the resistance of the resistor R2 and the capacitance of the storage capacitor C1 may be referred to as a discharge time constant of the RC sub-circuit 221, and the product of the resistance of the resistor R4 and the capacitance of the storage capacitor C2 may be referred to as a discharge time constant of the RC sub-circuit 222. The discharge time constant is negatively correlated to the discharge rate. If the resistance of the resistor R2 is greater than the resistance of the resistor R4, and the capacitance of the storage capacitor C1 and capacitance of the inductor C2 are equal, the discharge time constant of the RC sub-circuit 221 will be greater than the discharge time constant of the RC sub-circuit 222, and the RC sub-circuit 221 will be discharged at a rate less than the RC sub-circuit 222. At Time t2, the storage capacitor C1 reaches the second voltage V2, as expressed by Equation (2):

$$V2 = Ic * Ton * \exp(-Toff/\tau 1) \quad \text{Equation (2)}$$

Where V2 is the second voltage;
Ic is the charging current;
Ton is the ON time.
Toff is the OFF time; and
$\tau 1$ is the discharge time constant of the RC sub-circuit 221.

At Time t2, the storage capacitor C2 reaches the second voltage V3, as expressed by Equation (3):

$$V3 = Ic * Ton * \exp(-Toff/\tau 2) \quad \text{Equation (3)}$$

Where V3 is the third voltage;
Ic is the charging current;
Ton is the ON time.
Toff is the OFF time; and
$\tau 2$ is the discharge time constant of the RC sub-circuit 222.

Since the ON time Ton and the OFF time Toff are unknown, the charging current Ic, the second voltage V2, the third voltage V3, the time constant $\tau 1$ and the time constant $\tau 2$ are known, the control circuit 24 may compute the ON time Ton and the OFF time Toff using Equations (2) and (3). In some embodiments, the charging current Ic, the time constant $\tau 1$, and the time constant $\tau 2$ are fixed values, and the control circuit 24 may use a look-up table to find the corresponding ON time Ton and OFF time Toff according to the second voltage V2 and the third voltage V3.

The RC circuit 22 in FIG. 3 may simultaneously acquire the second voltage V2 and the third voltage V3 at Time t2, speeding up the time required for acquiring the ON time Ton and the OFF time Toff.

Figure 5:
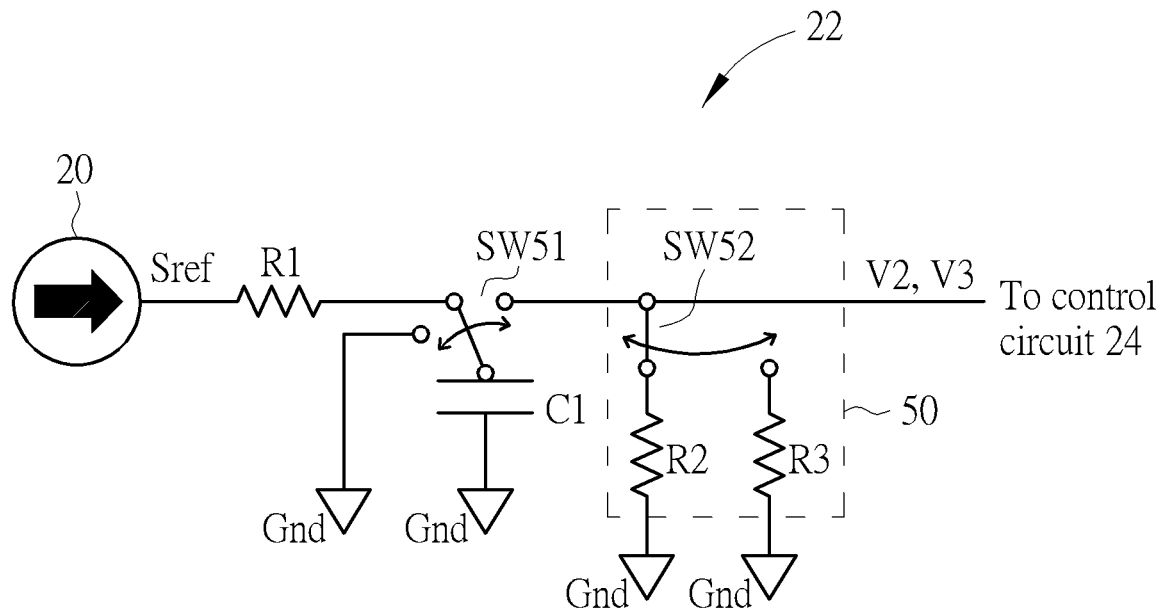
FIG. 5 is a circuit schematic of a resistor-capacitor circuit in FIG. 2 according to another embodiment of the invention.

FIG. 5 is a schematic diagram of the RC circuit 22 according to another embodiment of the invention. The RC circuit 22 in FIG. 5 is coupled to the current source 20 and the control circuit 24, and includes a resistance R1, a storage capacitor C1, a variable resistor circuit 50, and a switch SW51. The resistor R1 includes a first terminal configured to receive the reference signal Sref from the current source 20; and a second terminal. The variable resistor circuit 50 may include a resistor R2, a resistor R3, and a switch SW52. The variable resistor circuit 50 includes a first terminal, and a second terminal coupled to the ground terminal Gnd. The variable resistor circuit 50 may selectively provide the resistance of the resistance R2 or the resistance of the resistance R3 using the switch SW52. The resistor R2 includes a first terminal, and a second terminal coupled to the ground terminal Gnd. The resistor R3 includes a first terminal, and a second terminal coupled to the ground terminal Gnd. The switch SW52 includes a first terminal coupled to the first terminal of the variable resistor circuit 50, and a second terminal selectively coupled to the first terminal of the resistor R2 or the first terminal of the resistor R3. The resistance of the resistor R2 and the resistance of the resistor R3 may be different. The capacitor C1 includes a first terminal selectively coupled to the ground terminal Gnd, the second terminal of the resistor R1 or the first terminal of the variable resistor circuit 50 via the switch SW51; and a second terminal coupled to the ground terminal Gnd. The switching of the switch SW51 and the switch SW52 may be controlled by a circuit external to the device 2. Please refer to FIG. 4, the switch SW51 may be configured to reset the storage capacitor C1 at Time t0, charge the storage capacitor C1 between Time t0 and Time t1, and discharge the storage capacitor C1 between Time t1 and Time t2. The switch SW51 may couple the first terminal of the storage capacitor C1 to the ground terminal Gnd to reset the storage capacitor C1, couple the first terminal of the storage capacitor C1 to the second terminal of the resistor R1 to charge the storage capacitor C1, or couple the first terminal of the storage capacitor C1 to the first terminal of the variable resistor circuit 50 to discharge the storage capacitor C1.

The RC circuit 22 in FIG. 5 may sequentially acquire the second voltage V2 and the third voltage V3. The storage capacitor C1 may be pre-charged to generate the first voltage V1, and discharged in the first period to generate the second voltage V2, then recharged to generate the first voltage V1, and discharged again in the second period to generate the third voltage V3. During the first period and the second period, the switch SW51 may couple the first terminal of the storage capacitor C1 to the first terminal of the variable resistor circuit 50. In the first period, the switch SW52 is switched to the resistor R2, the variable resistor circuit 50 provides the resistance of the resistor R2, the storage capacitor C1 is discharged via the resistor R2, and after the first period has elapsed, the first terminal of the storage capacitor C1 will generate the second voltage V2. In the second period, the switch SW52 is switched to the resistor R3, the variable resistor circuit 50 provides the resistance of the resistor R3, the storage capacitor C1 is discharged via the resistor R3, and after the second period has elapsed, the first terminal of the storage capacitor C1 will generate the third voltage V3. The first period and the second period may not overlap with each other. In some embodiments, the second period may follow the first period, and the length of the first period and the length of the second period may be equal. For example, the length of the first period and the length of the second period may be equal to (t2-t0) in FIG. 4. In some embodiments, the first period and the second period correspond to two periods of a data packet, respectively, and each data packet may correspond to a different number of periods.

The control circuit 24 in FIG. 2 may acquire the ON time Ton and the OFF time Toff according to the second voltage V2 and the third voltage V3 using the method outlined by FIG. 4. Compared to FIG. 3, the RC circuit 22 of FIG. 5 employs fewer components, so as to reduce the circuit area.

In some embodiments, the resistor R2, the resistor R3, and the switch SW52 in the variable resistor circuit 50 may be replaced by a variable resistor. The variable resistor may be controlled to provide a first resistance in a first period and a second resistance in a second period. The first resistance and the second resistance are different. The storage capacitor C1 may be pre-charged to generate the first voltage V1. During the first period, the variable resistor provides the first resistance for discharging to generate the second voltage V2. The variable resistor is then recharged to generate the first voltage V1. During the second period, the variable resistor provides the second resistance for discharging again to generate the third voltage V3.

Figure 6:
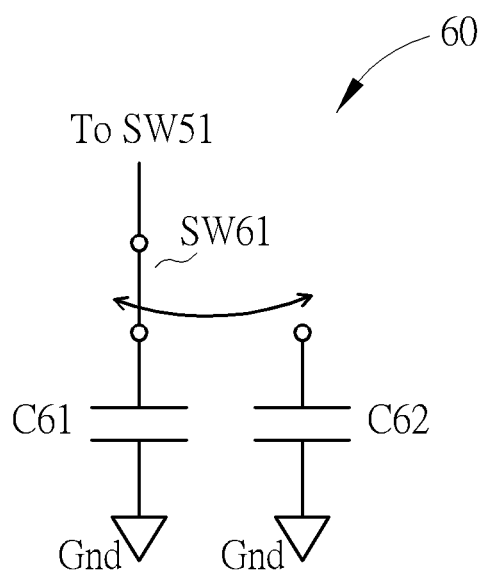
FIG. 6 is a circuit schematic of a storage capacitor circuit for replacing the storage capacitor in FIG. 5.

In some embodiments, the storage capacitor C1 in FIG. 5 may be replaced by a storage capacitor circuit 60 in FIG. 6. The storage capacitor circuit 60 includes a first terminal coupled to the switch SW51. The storage capacitor circuit 60 includes a capacitor C61, a capacitor C62, and a switch SW61. The capacitor C61 includes a first terminal, and a second terminal coupled to the ground terminal Gnd. The capacitor C62 includes a first terminal, and a second terminal coupled to the ground terminal Gnd. The capacitor C61 has a first capacitance, the capacitor C62 has a second capacitance, and the first capacitance and the second capacitance are different. The switch SW61 includes a first terminal coupled to the first terminal of the storage capacitor circuit 60, and a second terminal selectively coupled to the first terminal of the capacitor C61 or the first terminal of the capacitor C62.

The storage capacitor circuit 60 may provide a first capacitance or a second capacitance to adjust the first voltage V1, the second voltage V2, and the third voltage V3. When the switch SW61 is switched to the first terminal of the capacitor C61, the storage capacitor circuit 60 may provide the first capacitance. When the switch SW61 is switched to the first terminal of the capacitor C62, the storage capacitor circuit 60 may provide the second capacitance.

Figure 7:
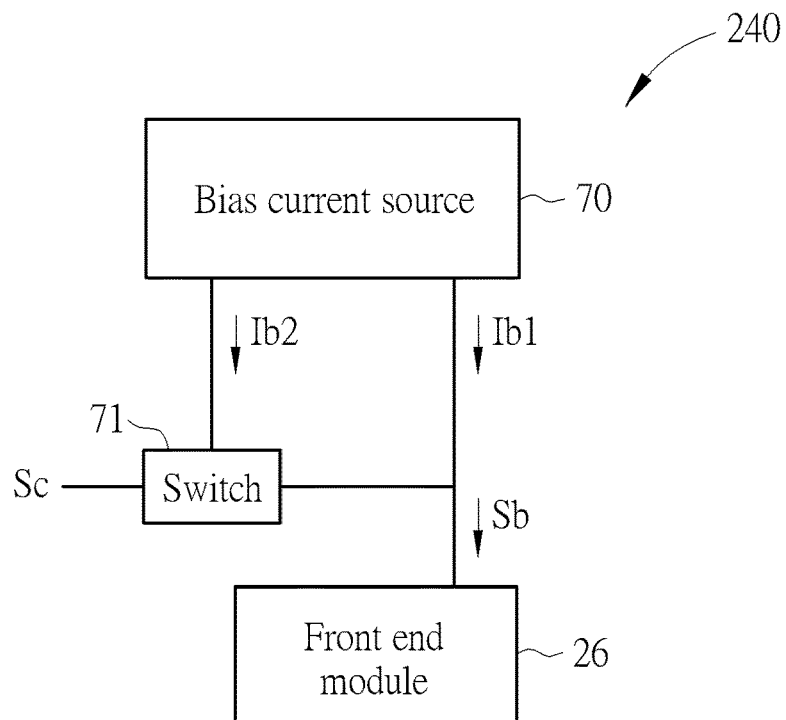
FIG. 7 is a circuit schematic of the adjustment circuit in FIG. 2 according to an embodiment of the invention.

FIG. 7 is a circuit schematic of the adjustment circuit 240 according to an embodiment of the invention. In some embodiments, the adjustment circuit 240 may adjust the bias signal Sb according to the adjustment signal Sc, and transmit the bias signal Sb to the front end module 26, the bias signal Sb being a current signal. The adjustment circuit 240 includes a bias current source 70 and a switch 71 coupled to each other. The bias current source 70 may generate a bias current Ib1 and a bias current Ib2. The bias current Ib1 and the bias current Ib2 may be identical or different. The adjustment circuit 240 may generate an adjustment signal Sc according to the ON time Ton. In some embodiments, when the ON time Ton is less than a predetermined ON time, the adjustment signal Sc may be set to logic low, the switch 71 is turned off, and the bias signal Sb is equal to the bias current Ib1. When the ON time Ton exceeds the predetermined ON time, the adjustment signal Sc may be set to logic high, the switch 71 is turned on, and the bias signal Sb is equal to the sum of the bias current Ib1 and the bias current Ib2. In this manner, the adjustment circuit 240 may increase the bias signal Sb when the ON time Ton exceeds the predetermined ON time (larger duty cycle), so that the gain of the front end module 26 remains unchanged.

Figure 8:
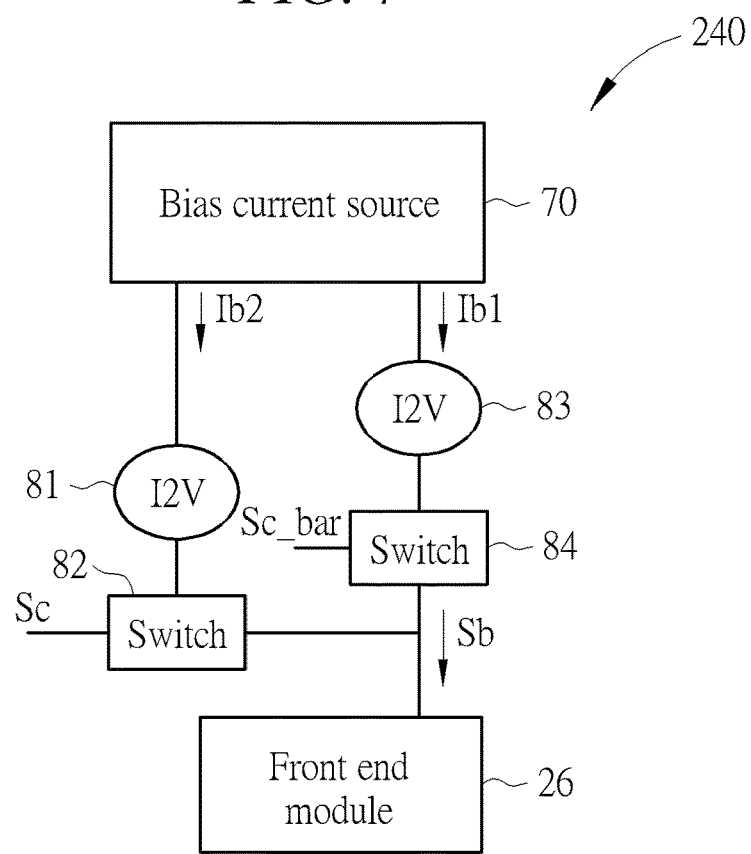
FIG. 8 is a circuit schematic of the adjustment circuit in FIG. 2 according to another embodiment of the invention.

FIG. 8 is a circuit schematic of the adjustment circuit 240 according to another embodiment of the invention. In some embodiments, the adjustment circuit 240 may adjust the bias signal Sb according to an adjustment signal Sc and an adjustment signal Sc_bar, and transmit the bias signal Sb to the front end module 26, the bias signal Sb being a voltage signal. The adjustment circuit 240 includes a bias current source 70, a current-to-voltage converter (I2V) 81, a switch 82, a current-to-voltage converter 83 and a switch 84. The current-to-voltage converter 81 and the current-to-voltage converter 83 are both coupled to the bias current source 70. The switch 82 is coupled to the current-to-voltage converter 81 and the front end module 26. The switch 84 is coupled to the current-to-voltage converter 83 and the front end module 26.

The bias current source 70 may generate a bias current Ib1 and a bias current Ib2. The bias current Ib1 and the bias current Ib2 may be different. For example, the bias current Ib1 may be less than the bias current Ib2. The current-to-voltage converter 81 may generate a low voltage according to the bias current Ib2, and the current-to-voltage converter 83 may generate a high voltage according to the bias current Ib1, and the high voltage may exceed the low voltage. The adjustment circuit 240 may generate the adjustment signal Sc and the adjustment signal Sc_bar according to the ON time Ton. The adjustment signal Sc and the adjustment signal Sc_bar may be opposite in phase. In some embodiments, when the ON time Ton is less than the predetermined ON time, the adjustment signal Sc may be set to logic low, the switch 82 is turned off, the adjustment signal Sc_bar may be set to logic high, the switch 84 is turned on, and the bias signal Sb is equal to a low voltage. When the ON time Ton exceeds the predetermined ON time, the adjustment signal Sc may be set to logic high, the switch 82 is turned on, the adjustment signal Sc_bar may be set to logic low, the switch 84 is turned off, and the bias signal Sb is equal to a high voltage. In this manner, the adjustment circuit 240 may increase the adjustment signal Sc when the ON time Ton exceeds the predetermined ON time (larger duty cycle), so that the gain of the front end module 26 remains unchanged.

While the embodiments of FIGS. 7 and 8 only provide two different levels of bias signals Sb, those skilled in the art would recognize that other numbers of bias signals Sb may be provided based on similar principles of the present invention.

Figure 9:
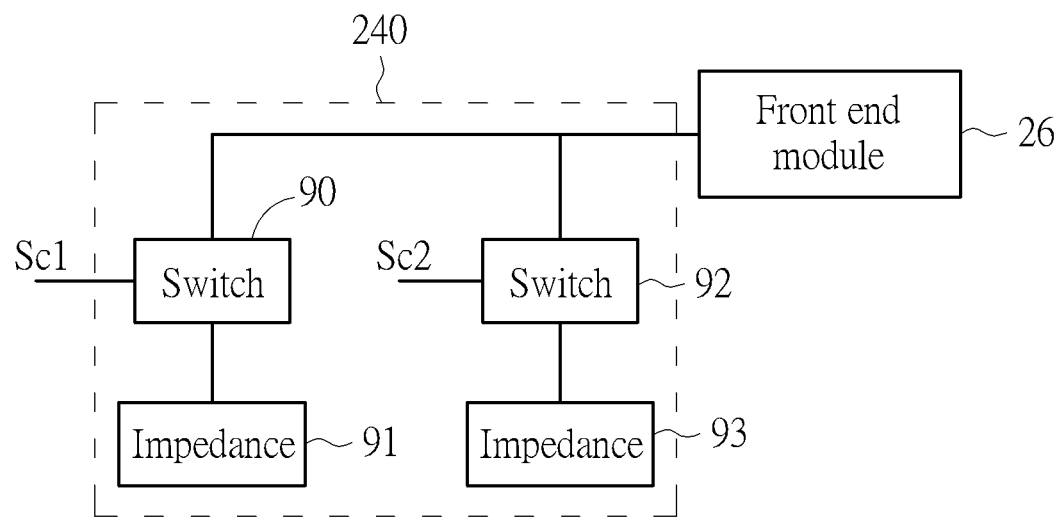
FIG. 9 is a circuit schematic of the adjustment circuit in FIG. 2 according to another embodiment of the invention.

FIG. 9 is a circuit schematic of the adjustment circuit 240 according to another embodiment of the invention. In some embodiments, the adjustment circuit 240 may adjust the input impedance of the front end module 26 according to the adjustment signal Sc1 and the adjustment signal Sc2. The adjustment circuit 240 includes a switch 90, a switch 92, an impedance 91, and an impedance 93. The switch 90 may be coupled to the impedance 91 and the front end module 26. The switch 92 may be coupled to the switch 90, the impedance 93 and the front end module 26. The impedance of the impedance 91 and the impedance of the impedance 93 may be identical or different.

The adjustment circuit 240 may generate the adjustment signal Sc1 and the adjustment signal Sc2 according to the ON time Ton. In some embodiments, when the ON time Ton is less than the first predetermined ON time, the adjustment signal Sc1 may be set to logic high, the switch 90 is turned on, the adjustment signal Sc2 may be set to logic high, the switch 92 is turned on, and the input impedance of the front end module 26 is equal to a first equivalent impedance of the internal input impedance of the front end module 26, the impedance 91 and the impedance 93.

When the ON time Ton exceeds the first predetermined ON time and is less than the second predetermined ON time, the adjustment signal Sc1 may be set to logic high, the switch 90 is turned on, the adjustment signal Sc2 may be set to logic low, the switch 92 is turned off, and the input impedance of the front end module 26 is equal to a second equivalent impedance of the internal input impedance of the front end module 26 and the impedance 91. The second predetermined ON time may exceed the first predetermined ON time, and the second equivalent impedance may be less than the first equivalent impedance.

When the ON time Ton exceeds the second predetermined ON time, the adjustment signal Sc1 may be set to logic low, the switch 90 is turned off, the adjustment signal Sc2 may be set to logic low, the switch 92 is turned off, and the input impedance of the front end module 26 is equal to the internal input resistance of the front end module 26. The internal input impedance of the front end module 26 may be less than the second equivalent impedance. The adjustment circuit 240 may provide the first equivalent impedance and the second equivalent impedance according to the adjustment signal Sc1 and the adjustment signal Sc2. In other words, the adjustment circuit 240 may generate the adjustment signal Sc1 and the adjustment signal Sc2 to provide the first equivalent impedance or the second equivalent impedance according to the ON time Ton, so as to adjust the impedance based on actual requirement, thereby achieving an appropriate impedance matching.

In this manner, the adjustment circuit 240 may control the adjustment signal Sc according to the duty cycle to maintain an appropriate input impedance, so as to provide a favorable performance of the front end module 26 such as increased linearity, an increased signal-to-noise ratio, higher power, a constant gain and enhanced stability. Due to different designs of the front end module 26, the gain of the front end module 26 may have a positive or negative correlation with the input impedance. The gain of the front end module 26 may be maintained by adjusting the value of the input impedance.

While the embodiment of FIG. 9 only utilizes the impedance of the impedance 91 and the impedance of the impedance 93 to achieve the impedance matching, those skilled in the art would recognize that other impedances may be achieved based on similar principles, so as to achieve dynamically adjustment of impedance matching. In addition, while FIG. 9 shows the embodiment of adjusting the input impedance of the front end module 26, those skilled in the art would recognize that the output impedance of the front end module 26 may be adjusted based on similar principles. For example, the adjustment circuit 240 may be coupled to the output terminal of the front end module 26 to adjust the output impedance of the front end module 26.

Figure 10:
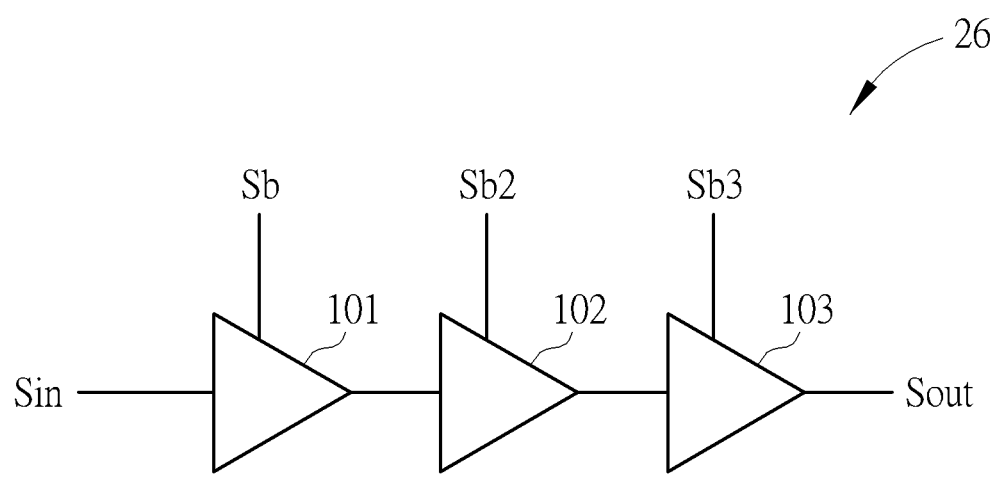
FIG. 10 is a schematic diagram of a front end module in FIG. 2.

FIG. 10 is a schematic diagram of the front end module 26. The front end module 26 may include an amplifier, and the amplifier may include amplification stages 101 to 103 coupled in sequence. The amplification stage 101 receives the input signal Sin and the bias signal Sb to generate a first amplification signal. The amplification stage 102 receives the first amplification signal and the bias signal Sb2 to generate a second amplification signal. The amplification stage 103 receives the second amplification signal and the bias signal Sb3 to generate the output signal Sout. The bias signal Sb may be a current signal. The ON time is also the time of the amplifier being turned on. When the ON time is longer, the bias signal Sb is larger, and as a result, the gain of the amplification stage 101 and the front end module 26 will remain unchanged, thereby reducing the error vector magnitude.

While only the bias signal Sb of the amplification stage 101 is adjusted according to the duty cycle in the embodiment of FIG. 10, in some embodiments, the bias signal Sb2 and/or the bias signal Sb3 may also be adjusted based on the similar principle. In addition, the front end module 26 is not limited to a three-stage amplifier, and the invention of the present application may be adapted to other numbers of front end components adopted in the front end module 26. For example, the front terminal component may also be a filter or a buffer.

The embodiment of the present invention also discloses a compensation circuit including an RC circuit 22 and a control circuit 24. The RC circuit 22 of FIG. 2 may generate the first voltage V1 when the reference signal Sref is in the first state, and generate the second voltage V2 and the third voltage V3 when the reference signal Sref is in the second state. The control circuit 24 may be coupled to the RC circuit 22, and may acquire the ON time Ton of the front end module 26 according to the first voltage V1, the second voltage V2, and the third voltage V3. The control circuit 24 may include the adjustment circuit 240. The adjustment circuit 240 may generate bias signal Sb according to the ON time Ton, and output the bias signal Sb to the front end module 26. The front end module 26 may be an amplifier including N amplification stages, N being a positive integer. For example, N is equal to 3. In some embodiments, the bias signal Sb and the ON time Ton are positively correlated. The adjustment circuit 240 outputs the bias signal Sb to the first amplification stage 101 of the three amplification stages. In other embodiments, the bias signal Sb and the ON time Ton may also be negatively correlated in order to meet different design requirements. The adjustment circuit 240 may further output the bias signals to the other amplification stages of the 3 amplification stages based on different design requirements. In this manner, the adjustment circuit 240 may output the bias signal Sb to one or more of the 3 amplification stages to maintain the gain of the front end module 26.

In some embodiments, the adjustment circuit 240 of FIG. 9 may further be coupled to the input terminal of the front end module 26 to adjust the impedance of the adjustment circuit 240, so as to maintain the gain of the front end module 26. In other embodiments, the adjustment circuit 240 of FIG. 9 may further be coupled to the input terminal of the amplification stage 102 and the input terminal of the amplification stage 103 for adjusting the input impedances of the amplification stages 102 and 103, so as to maintain the gain of the front end module 26.

The embodiments in FIGS. 2, 3, 5 to 10 are configured to measure the duty cycle, and perform gain compensation on the front end module 26 according to the duty cycle, maintaining the linearity of the front end module 26 unchanged, while reducing the error vector magnitude.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device of measuring duty cycles comprising:
a resistor-capacitor circuit configured to generate a first voltage when a reference signal is in a first state, and generate a second voltage and a third voltage when the reference signal is in a second state, the resistor-capacitor circuit comprising:
a first resistor-capacitor sub-circuit and
a second resistor-capacitor sub-circuit, wherein the first resistor-capacitor sub-circuit and the second resistor-capacitor sub-circuit operate simultaneously to compute an ON time; and
a control circuit coupled to the first resistor-capacitor sub-circuit and the second resistor-capacitor sub-circuit to acquire the ON time according to the first voltage, the second voltage and the third voltage, wherein the ON time is approximately equal to a time of the reference signal being in the first state.

2. The device of claim 1, wherein the first resistor-capacitor sub-circuit includes a first path and a second path, and the first path and the second path share a first storage capacitor.

3. The device of claim 2, wherein:
when the reference signal is in the first state, the reference signal charges the first storage capacitor via the first path; and
when the reference signal is in the second state, the first storage capacitor is configured to be discharged via the second path.

4. The device of claim 1, wherein:
the first resistor-capacitor sub-circuit is configured to generate the second voltage after the reference signal is in the second state for an OFF time; and
the second resistor-capacitor sub-circuit is configured to generate the third voltage after the reference signal is in the second state for the OFF time.

5. The device of claim 1, wherein the reference signal is generated by a current source.

6. The device of claim 1, wherein the reference signal is generated by a band gap circuit.

7. The device of claim 1, wherein the reference signal is generated by a low dropout voltage regulator.

8. The device of claim 1, wherein the control circuit acquires the time of the reference signal being in the first state from a look-up table according to the first voltage, the second voltage and the third voltage.

9. The device of claim 1, wherein the control circuit comprises an adjustment circuit configured to generate an adjustment signal according to the time of the reference signal being in the first state, and adjust a front end module according to the adjustment signal.

10. A device of measuring duty cycles comprising:
a resistor-capacitor circuit configured to generate a first voltage when a reference signal is in a first state, and generate a second voltage and a third voltage when the reference signal is in a second state, the resistor-capacitor circuit comprising:
a first resistor circuit comprising a first terminal configured to receive the reference voltage, and a second terminal;
a second resistor circuit comprising a first terminal, and a second terminal coupled to a ground terminal and configured to selectively provide a first resistance or a second resistance; and
a storage capacitor circuit comprising a first terminal selectively coupled to the second terminal of the first resistor circuit or the first terminal of the second resistor circuit, and a second terminal coupled to the ground terminal; and
a control circuit coupled to the resistor-capacitor circuit to acquire an ON time according to the first voltage, the second voltage and the third voltage, wherein the ON time is approximately equal to a time of the reference signal being in the first state;
wherein in a first period, the second resistor circuit provides the first resistance, and after the first period has elapsed, the first terminal of the storage capacitor circuit generates the second voltage; and
in a second period, the second resistor circuit provides the second resistance, and after the second period has elapsed, the first terminal of the storage capacitor circuit generates the third voltage.

11. The device of claim 10, wherein the second resistor circuit is a variable resistor.

12. The device of claim 10, wherein the second resistor circuit comprises:
a first resistor comprising a first terminal, and a second terminal coupled to the ground terminal, and having a first resistance, and
a second resistor comprising a first terminal, and a second terminal coupled to the ground terminal, and having a second resistance; and
a switch comprising a first terminal coupled to the first terminal of the second resistor circuit, a second terminal selectively coupled to the first terminal of the first resistor or the first terminal of the second resistor.

13. The device of claim 10, wherein the storage capacitor circuit comprises:
a first capacitor comprising a first terminal, and a second terminal coupled to the ground terminal, and having a first capacitance; and
a second capacitor comprising a first terminal, and a second terminal coupled to the ground terminal, and having a second capacitance; and
a switch comprising a first terminal coupled to the first terminal of the storage capacitor circuit, a second terminal selectively coupled to the first terminal of the first capacitor or the first terminal of the second capacitor.

14. The device of claim 6, wherein the control circuit acquires the ON time from a look-up table according to the first voltage, the second voltage and the third voltage.

15. The device of claim 10, wherein the control circuit comprises an adjustment circuit configured to generate an adjustment signal according to the time of the reference signal being in the first state, and adjust a front end module according to the adjustment signal.

16. A device of measuring duty cycles comprising:
a resistor-capacitor circuit configured to generate a first voltage when a reference signal is in a first state, and generate a second voltage and a third voltage when the reference signal is in a second state; and a control circuit coupled to the resistor-capacitor circuit to acquire an ON time according to the first voltage, the second voltage and the third voltage, wherein the ON time is approximately equal to a time of the reference signal being in the first state, the control circuit comprising an adjustment circuit configured to generate an adjustment signal according to the ON time, and adjust an input impedance and/or output impedance of a front end module according to the adjustment signal.

17. The device of claim 16, wherein the front end module is an amplifier circuit.

18. The device of claim 16, wherein the adjustment circuit is further configured to generate a bias signal according to the adjustment signal, and output the bias signal to the front end module.

19. The device of claim 16, wherein the control circuit acquires the time of the reference signal being in the first state from a look-up table according to the first voltage, the second voltage and the third voltage.

* * * * *